United States Patent
Chang et al.

(10) Patent No.: US 9,614,270 B2
(45) Date of Patent: Apr. 4, 2017

(54) SUPERCONDUCTING AIRBRIDGE CROSSOVER USING SUPERCONDUCTING SACRIFICIAL MATERIAL

(71) Applicant: International Business Machines Corporation, Armonk, NY (US)

(72) Inventors: Josephine B. Chang, Bedford Hills, NY (US); John M. Cotte, New Fairfield, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 18 days.

(21) Appl. No.: 14/700,335

(22) Filed: Apr. 30, 2015

(65) Prior Publication Data

US 2016/0322693 A1    Nov. 3, 2016

(51) Int. Cl.
*H01P 7/08* (2006.01)
*H01P 3/08* (2006.01)
*H01P 7/06* (2006.01)

(52) U.S. Cl.
CPC ............... *H01P 7/08* (2013.01); *H01P 3/08* (2013.01); *H01P 7/06* (2013.01)

(58) Field of Classification Search
CPC .. H01P 7/08; H01P 1/203; H01P 3/026; H01P 3/08
USPC ............ 333/24 R, 173, 204, 246, 99 S
See application file for complete search history.

(56) References Cited

U.S. PATENT DOCUMENTS

| 5,212,147 | A | 5/1993 | Sheats |
| 5,298,337 | A | 3/1994 | Hendricks |
| 5,510,645 | A | 4/1996 | Fitch et al. |
| 5,527,766 | A * | 6/1996 | Eddy ............ C04B 35/45 117/915 |
| 6,518,165 | B1 | 2/2003 | Yoon et al. |

(Continued)

OTHER PUBLICATIONS

Josephine B. Chang, et al.; "Superconducting Airbridge Crossover Using Superconducting Sacrificial Material"; U.S. Appl. No. 14/749,143, filed Jun. 24, 2015.

(Continued)

*Primary Examiner* — Dean Takaoka
*Assistant Examiner* — Alan Wong
(74) *Attorney, Agent, or Firm* — Cantor Colburn LLP; Vazken Alexanian

(57) ABSTRACT

A technique relates to a superconducting airbridge on a structure. A first ground plane, resonator, and second ground plane are formed on a substrate. A first lift-off pattern is formed of a first lift-off resist and a first photoresist. The first photoresist is deposited on the first lift-off resist. A superconducting sacrificial layer is deposited while using the first lift-off pattern. The first lift-off pattern is removed. A crossover lift-off pattern is formed of a second lift-off resist and a second photoresist. The second photoresist is deposited on the second lift-off resist. A cross-over superconducting material is deposited to be formed as the superconducting airbridge while using the cross-over lift-off pattern. The cross-over lift-off pattern is removed. The superconducting airbridge is formed to connect the first and second ground planes by removing the superconducting sacrificial layer underneath the cross-over superconducting material. The superconducting airbridge crosses over the resonator.

1 Claim, 20 Drawing Sheets

(56) References Cited

U.S. PATENT DOCUMENTS

| | | | |
|---|---|---|---|
| 7,078,695 B2 | 7/2006 | Luukanen | |
| 7,145,213 B1 * | 12/2006 | Ebel | H01H 59/0009 |
| | | | 257/414 |
| 7,245,196 B1 * | 7/2007 | Baliarda | H01P 1/20381 |
| | | | 333/219 |
| 7,855,623 B2 * | 12/2010 | Green | H01P 1/184 |
| | | | 333/128 |
| 8,872,359 B2 * | 10/2014 | Van Velzen | B81C 1/00333 |
| | | | 257/532 |
| 2006/0065622 A1 | 3/2006 | Floyd et al. | |

OTHER PUBLICATIONS

List of IBM Patents or Patent Applications Treated as Related—Date Filed: Aug. 24, 2015; 1 page.

J. B. Chang et al., "Suspended Superconducting Qubits," U.S. Appl. No. 13/834,291, filed Mar. 15, 2013.

M. Abuwasib et al., "Fabrication of large dimension aluminum air-bridges for superconducting quantum circuits," Journal of Vacuum Science & Technology B, vol. 31, No. 3, 2013, 031601, 6 pages.

M. Schicke et al., "Integrated niobium thin film air bridges as variable capacitors for superconducting GHz electronic circuits," IEEE Transactions on Applied Superconductivity, vol. 13, No. 2, 2003, pp. 135-137.

Z. Chen et al., "Fabrication and characterization of aluminum airbridges for superconducting microwave circuits," Applied Physics Letters, vol. 104, No. 5, 2014, 052602, 4 pages.

* cited by examiner

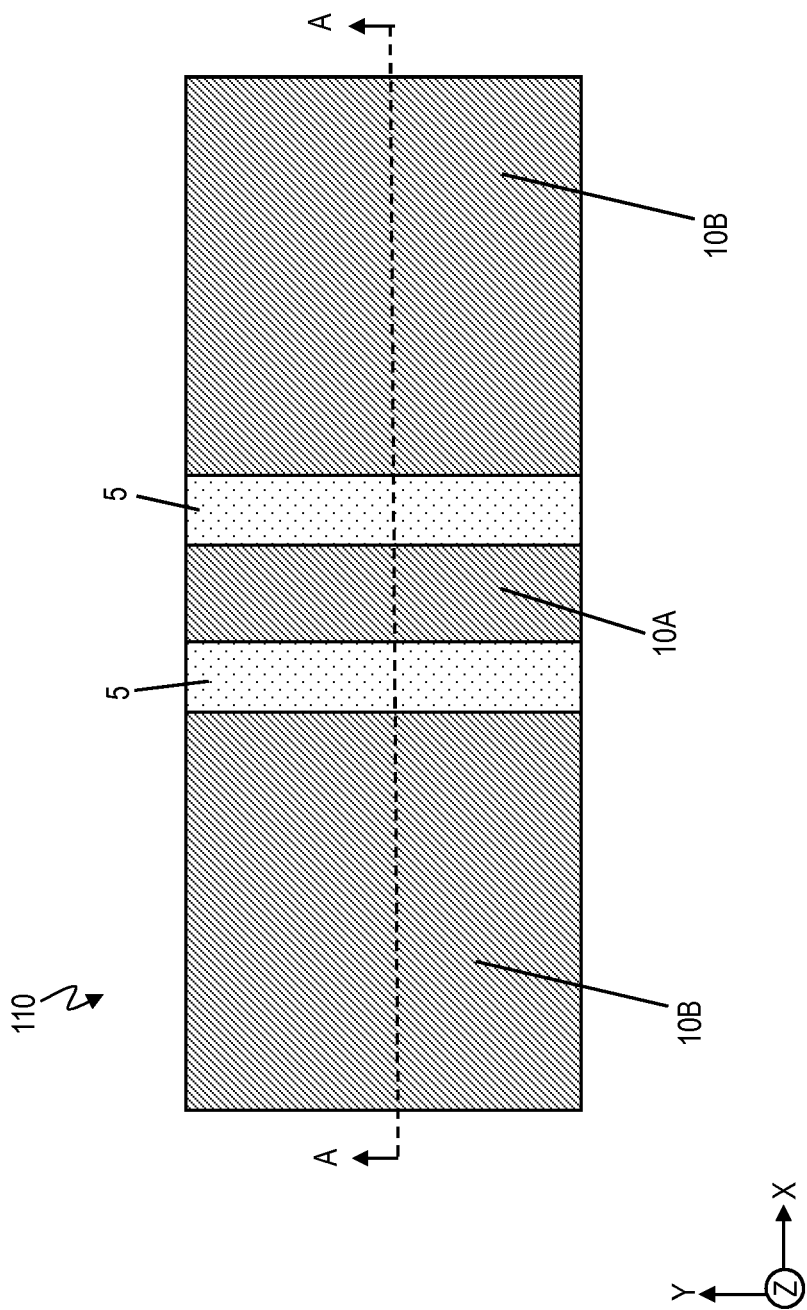

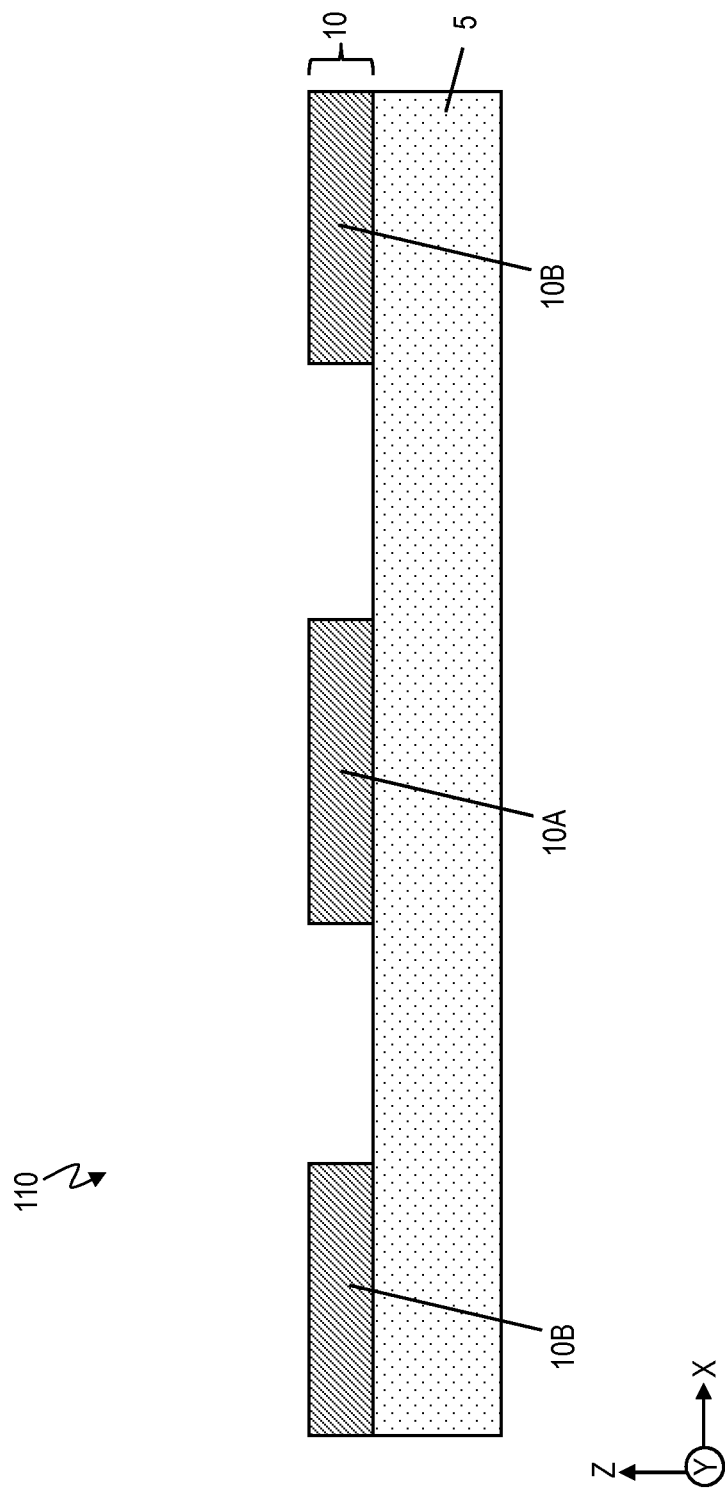

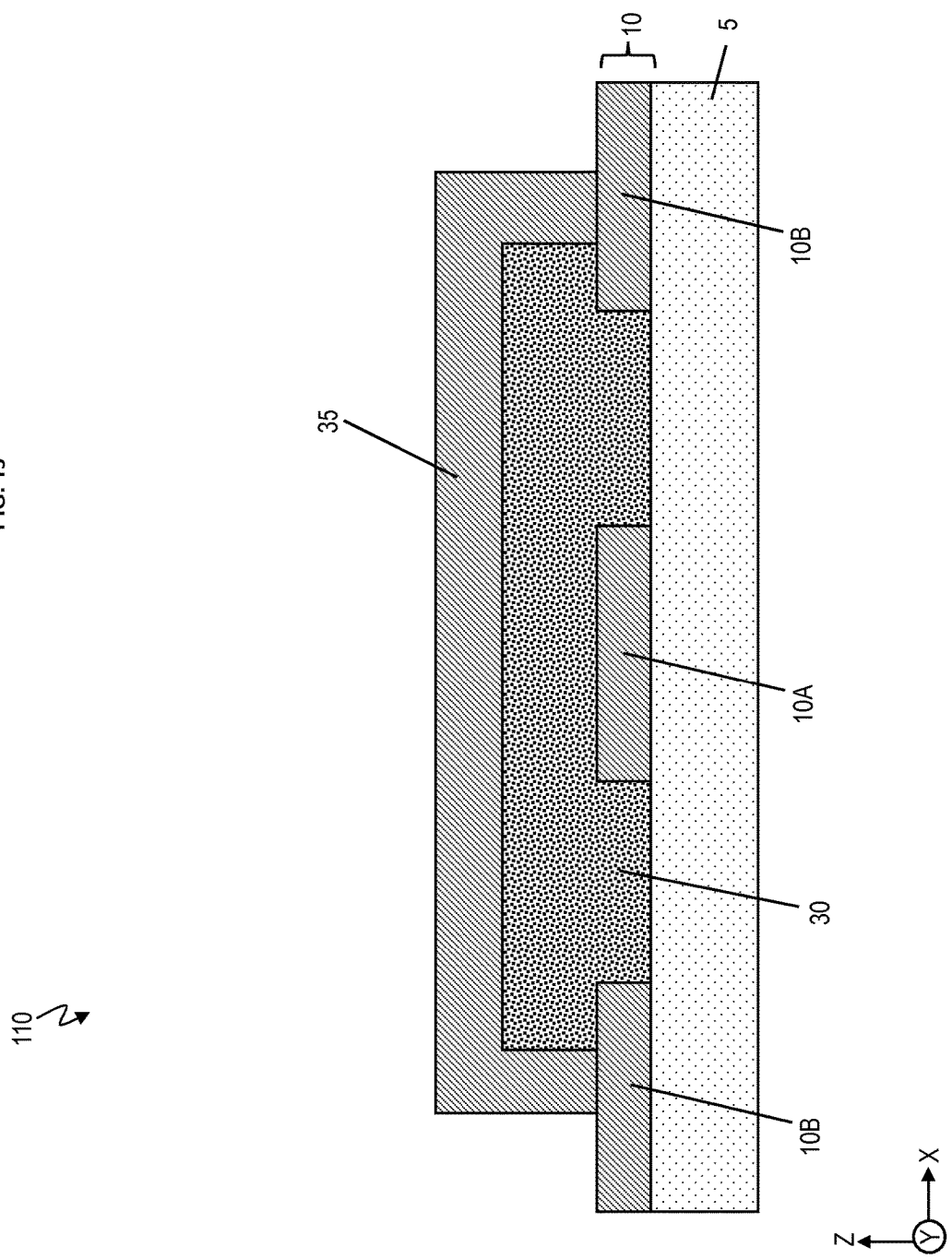

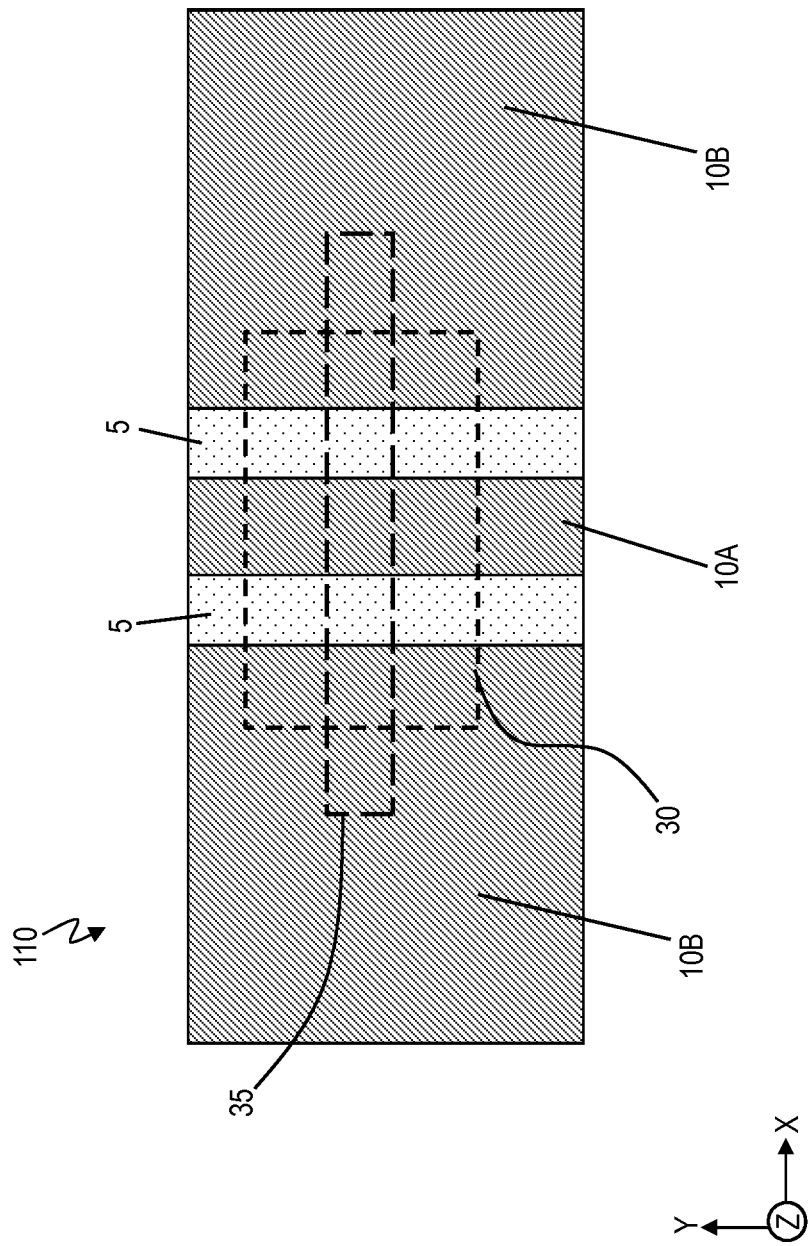

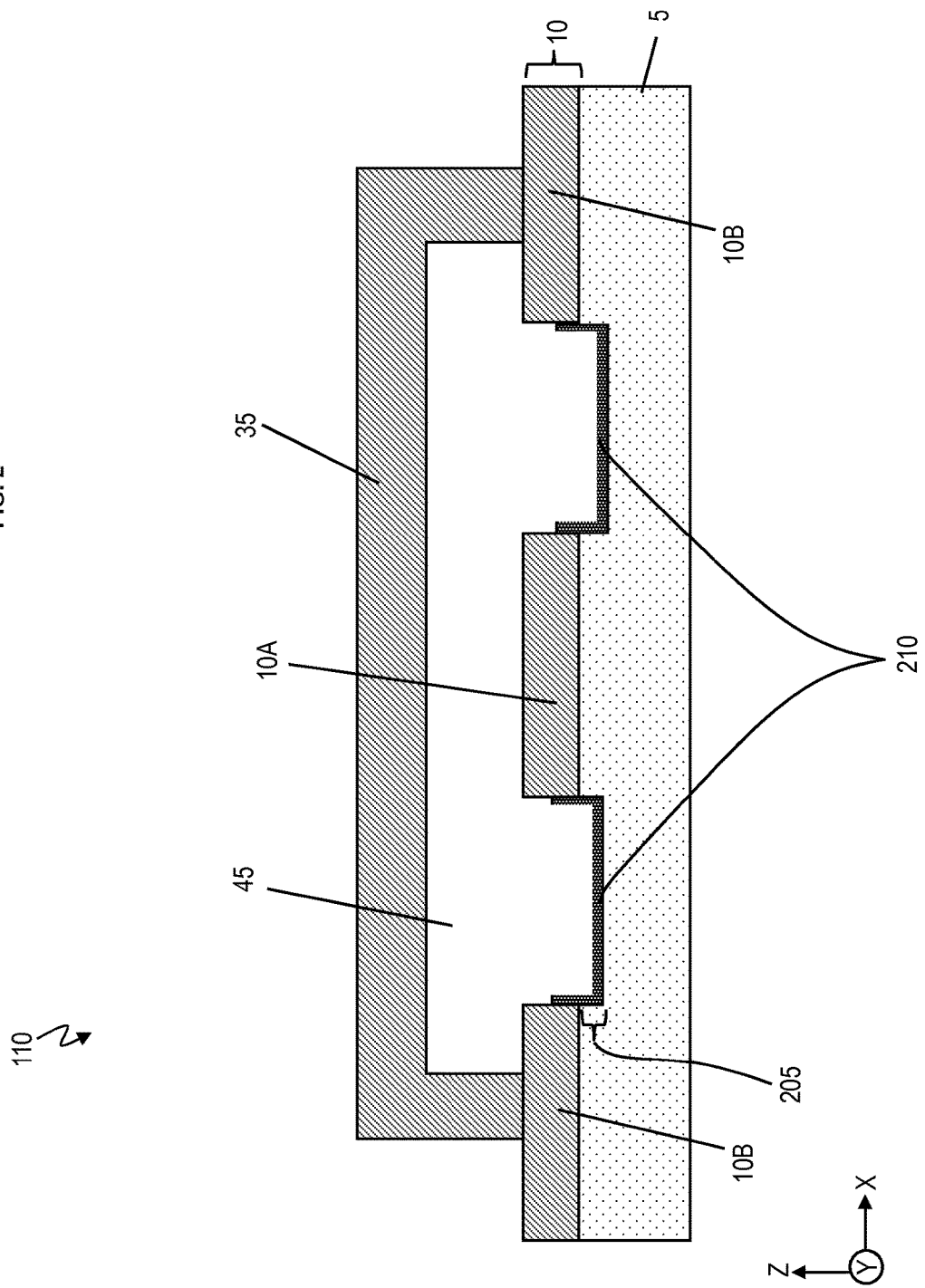

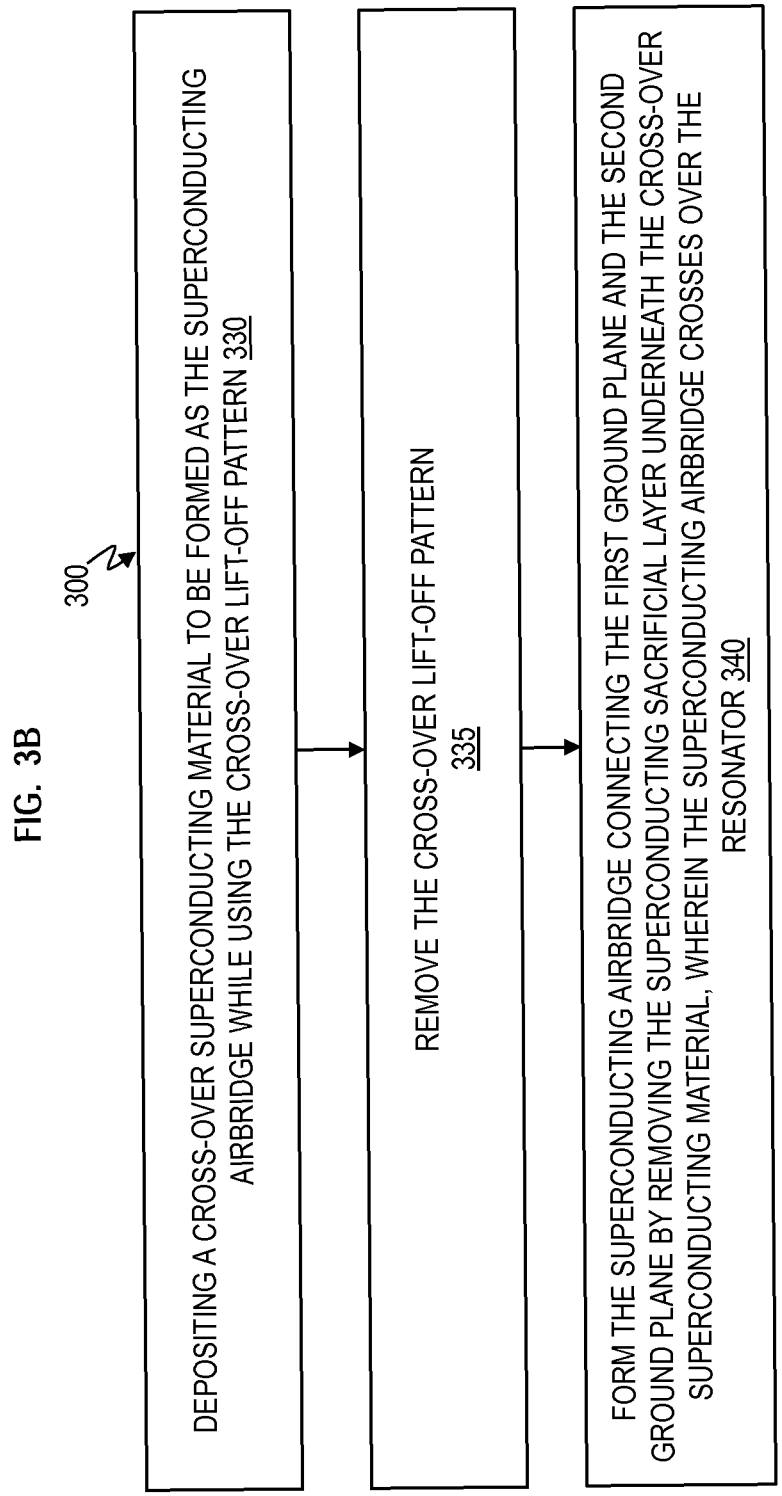

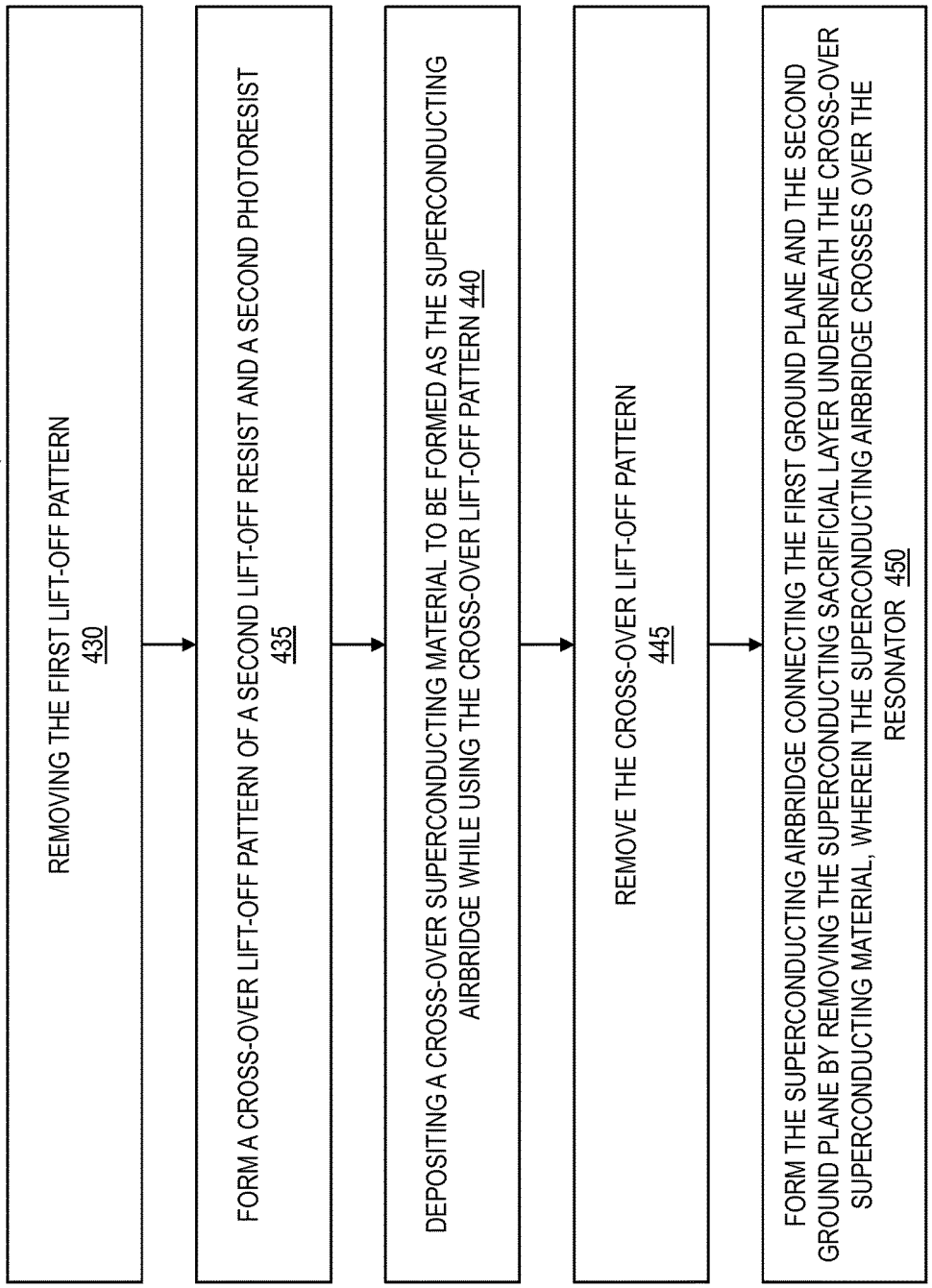

SUPERCONDUCTING AIRBRIDGE CROSSOVER USING SUPERCONDUCTING SACRIFICIAL MATERIAL

STATEMENT REGARDING FEDERALLY SPONSORED RESEARCH OR DEVELOPMENT

This invention was made with Government support under Contract No.: W911NF-10-1-0324 awarded by the Advanced Research Development Agency. The Government has certain rights to this invention.

BACKGROUND

The present invention relates to superconducting techniques, and more specifically, to a superconducting airbridge crossover using a superconducting sacrificial material.

Quantum computing employs resonant structures called qubits to store information, and resonators (e.g., as a two-dimensional (2D) planar waveguide or as a three-dimensional (3D) microwave cavity) to read out and manipulate the qubits. To date, a major focus has been on improving lifetimes of the qubits in order to allow calculations (i.e., manipulation and readout) to take place before the information is lost to decoherence of the qubits. Currently, qubit coherence times can be as high as 100 microseconds and efforts are being made to increase the coherence times. One area of research with respect to increasing coherence times is focused on eliminating material at the edges of the qubit (i.e., edges) in order to reduce the electric field in that area. The material in proximity to the qubit includes imperfections that support defects known as two-level systems (TLS).

SUMMARY

According to one embodiment, a method of forming a superconducting airbridge on a structure is provided. The method includes forming a first ground plane, a resonator, and a second ground plane on a substrate, and forming a first lift-off pattern of a first lift-off resist and a first photoresist, where the first photoresist is deposited on the first lift-off resist. The method includes depositing a superconducting sacrificial layer while using the first lift-off pattern, removing the first lift-off pattern, and forming a cross-over lift-off pattern of a second lift-off resist and a second photoresist. The second photoresist is deposited on the second lift-off resist. Also, the method includes depositing a cross-over superconducting material to be formed as the superconducting airbridge while using the cross-over lift-off pattern, removing the cross-over lift-off pattern, and forming the superconducting airbridge connecting the first ground plane and the second ground plane by removing the superconducting sacrificial layer underneath the cross-over superconducting material. The superconducting airbridge crosses over the resonator.

According to one embodiment, a method of forming a superconducting airbridge on a structure is provided. The method includes forming a first ground plane, a resonator, and a second ground plane all on a substrate, patterning the substrate to have recessed portions between the first ground plane and the resonator as well as between the resonator and the second ground plane, and forming a protective layer on the recessed portions. The method includes forming a first lift-off pattern of a first lift-off resist and a first photoresist, where the first photoresist is deposited on the first lift-off resist, depositing a superconducting sacrificial layer while using the first lift-off pattern, and removing the first lift-off pattern. Also, the method includes forming a cross-over lift-off pattern of a second lift-off resist and a second photoresist, where the second photoresist is deposited on the second lift-off resist, and depositing a cross-over superconducting material to be utilized as the superconducting airbridge while using the cross-over lift-off pattern. Further, the method includes removing the cross-over lift-off pattern, and forming the superconducting airbridge connecting the first ground plane and the second ground plane by removing the superconducting sacrificial layer underneath the cross-over superconducting material. The superconducting airbridge crosses over the resonator.

According to one embodiment, a superconducting microwave structure is provided. The structure includes a first ground plane, a resonator, and a second ground plane formed on a substrate. A superconducting airbridge connects the first ground plane and the second ground plane, and the superconducting airbridge has an airgap underneath from where a superconducting sacrificial layer has been removed. A residual portion of the superconducting sacrificial layer remains on at least one of the first ground plane, the resonator, the second ground plane, and/or the superconducting airbridge.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A through 1N illustrate a process of fabricating a superconducting airbridge using a superconducting sacrificial material according to an embodiment, in which:

FIG. 1A is a top-down view of a superconducting microwave structure;

FIG. 1B is a top-down view of an enlarged view of the superconducting microwave structure;

FIG. 1C is a cross-sectional view of the enlarged view of the superconducting microwave structure;

FIG. 1J is a cross-sectional view illustrating that the lift-off process removes the second lift-off pattern;

FIG. 1L is a top-down view illustrating the superconducting material crossing over the sacrificial superconducting material;

FIG. 1N is a cross-sectional view illustrating removal of the sacrificial superconducting material to form the superconducting airbridge;

FIG. 2 illustrates a cross-sectional view according to another embodiment;

FIGS. 3A and 3B together illustrate a method of forming a superconducting airbridge on a superconducting microwave structure according to an embodiment;

FIGS. 4A and 4B together illustrate a method of forming a superconducting airbridge on a superconducting microwave structure according to another embodiment.

DETAILED DESCRIPTION

In superconducting cavity quantum electrodynamics (cQED) circuits meant to be operated at microwave frequencies, separate ground planes should be tied together to prevent parasitic resonances which can be a source of decoherence for qubits within the circuit.

Most work in superconducting cQED circuits relies on wirebonding to tie together separate ground planes together. In the state-of-the-art, a microfabricated airbridge cross-over structure has been demonstrated which uses resist as a sacrificial material. As described in this reference, this process results in lossy resist residue (after the removal process for the sacrificial resist material) which degrades the performance of the device. Another disadvantage to the method described in this reference is the fact that the sacrificial material removal is not compatible with highly delicate tunnel junctions, and thus suspension (the airbridge) cannot be performed as the last step of device fabrication. (That is, the hardened resist used as a sacrificial material must be removed with processes such as $O_2$ plasma etching, but energetic processes such as $O_2$ plasma etching will breakdown the highly delicate tunnel junctions.) This leaves suspended structures which must be mechanically robust enough to survive the subsequent mechanically stressful steps such as dicing, lift-off with sonication, or wirebonding.

According to an embodiment, disclosed is the fabrication of superconducting airbridge cross-overs using a superconducting sacrificial material. This innovation is beneficial because the use of a superconducting sacrificial material minimizes any dielectric losses associated with residual sacrificial material (e.g., remaining after the removal process of the superconducting sacrificial material).

Additionally, embodiments disclose the use of a vapor etch, e.g., such as $XeF_2$, for the removal of superconducting sacrificial material under the cross-overs. The removal of superconducting sacrificial material is performed as a final step in the device fabrication, e.g., after all mechanically stressful steps such as dicing, lift-off with sonication, or wirebonding have been completed.

Figure 1A:
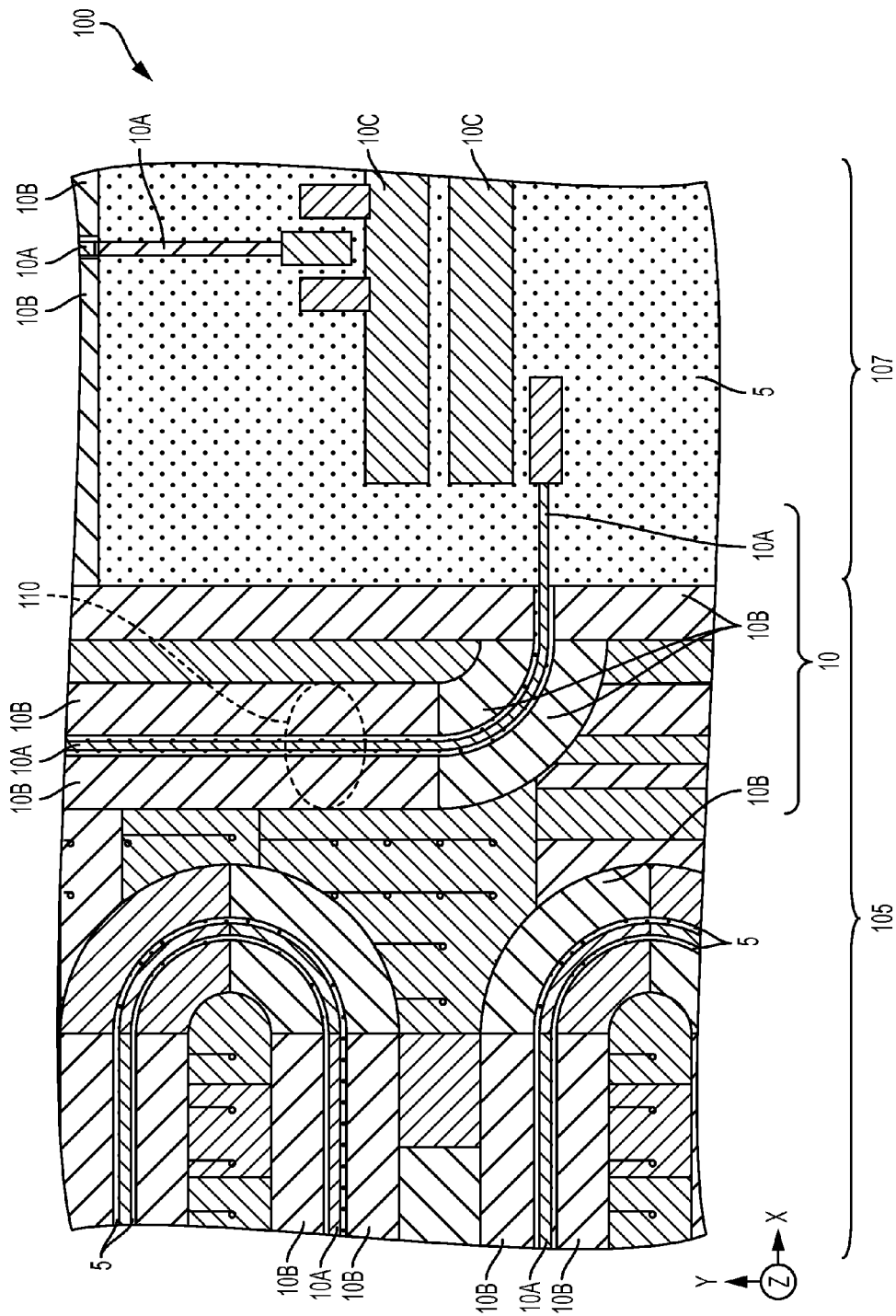
Figure 1D:
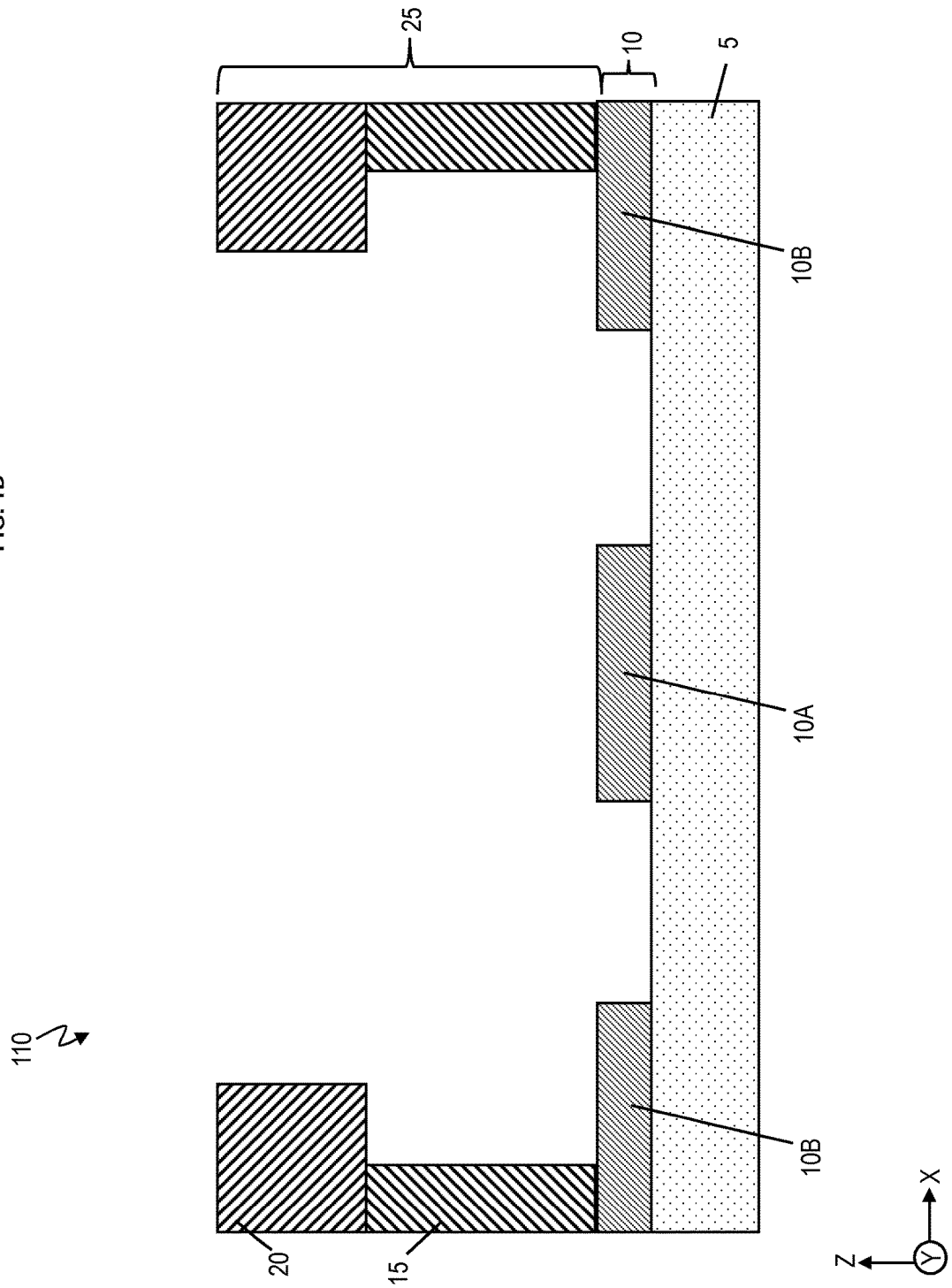
FIG. 1D is a cross-sectional view illustrating a lift-off pattern of bilayers.
Figure 1E:
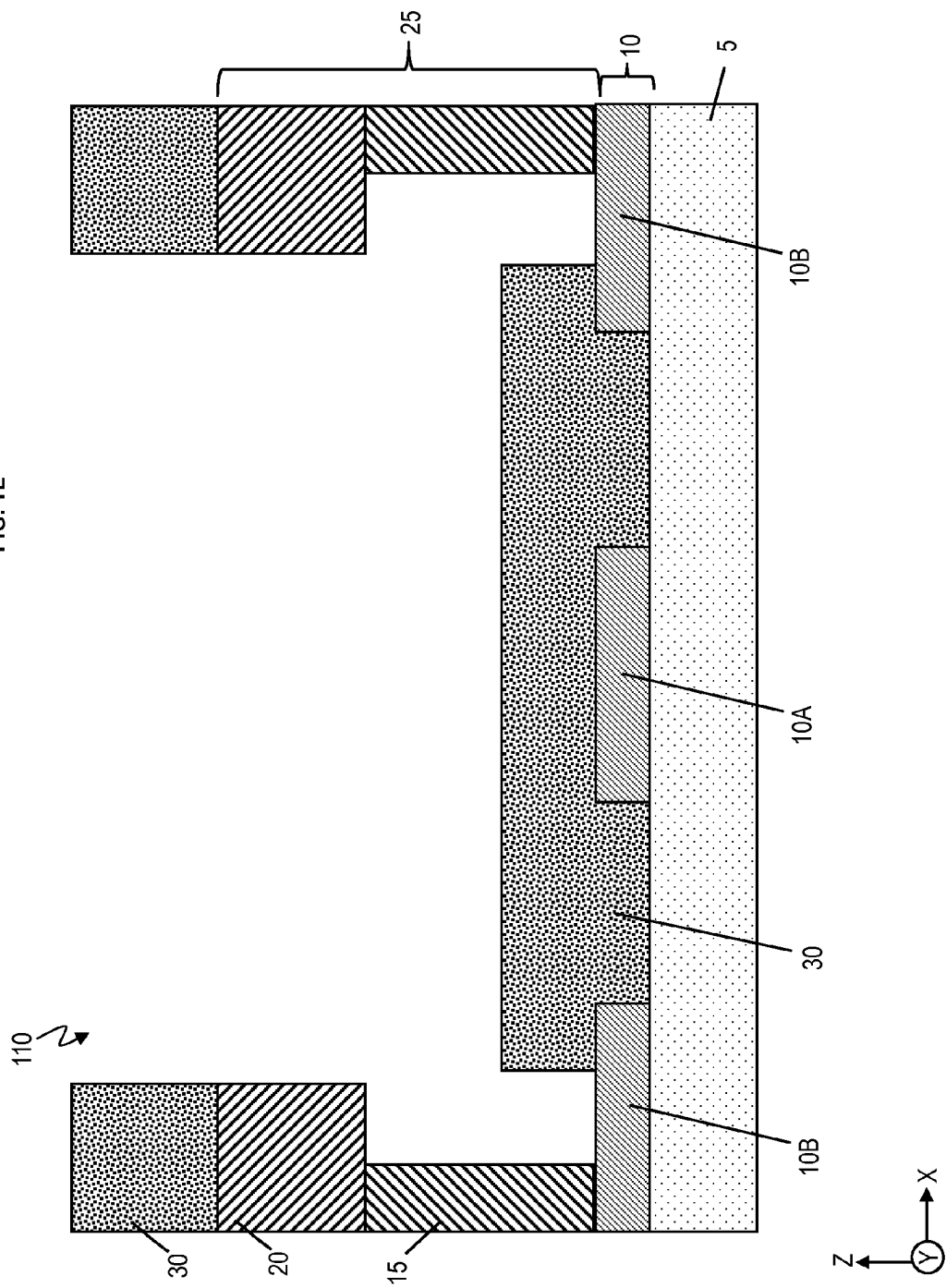
FIG. 1E is a cross-sectional view illustrating deposition of a sacrificial superconducting material.
Figure 1F:
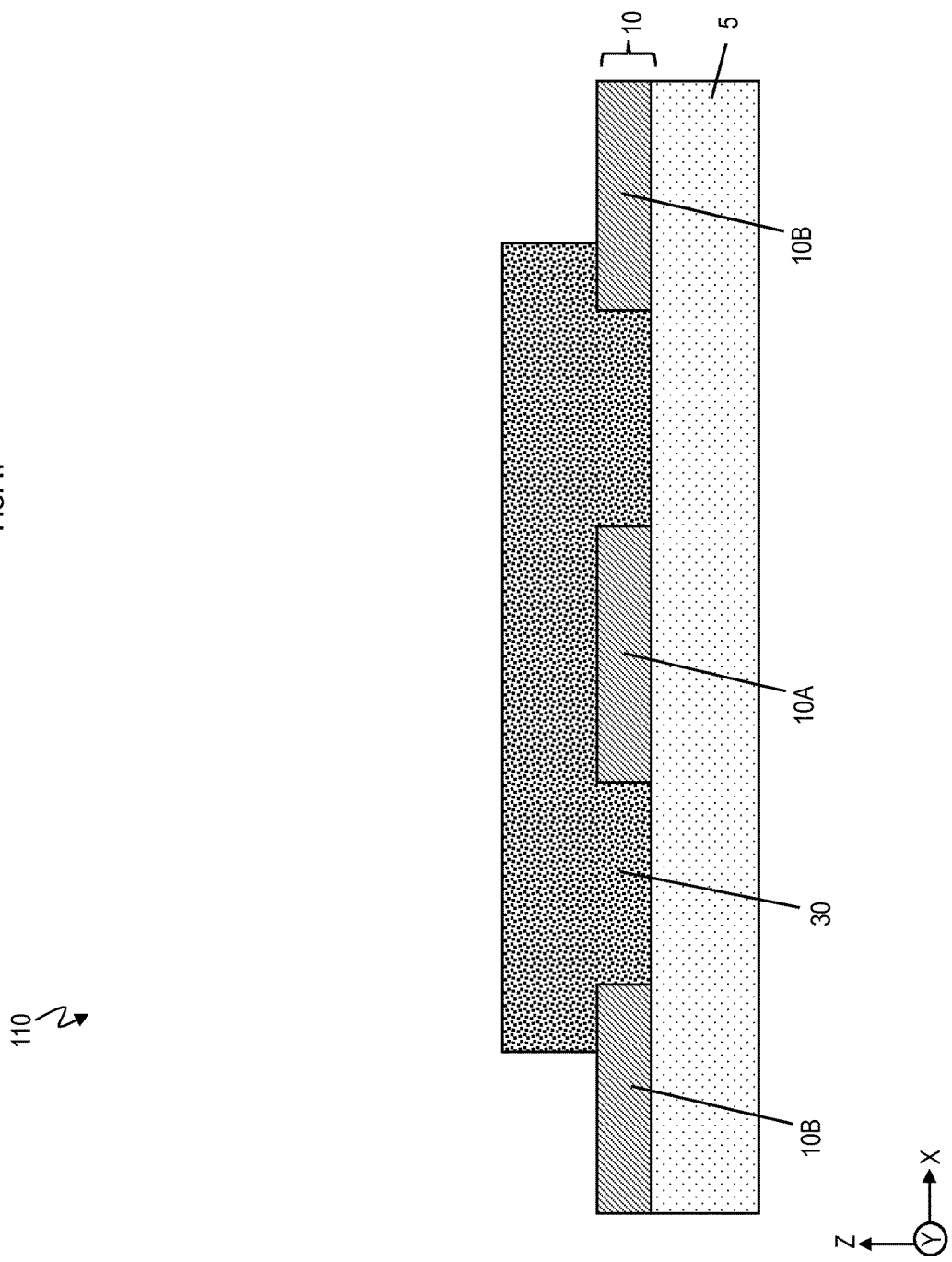
FIG. 1F is a cross-sectional view illustrating that the lift-off process removes the first lift-off pattern.
Figure 1G:
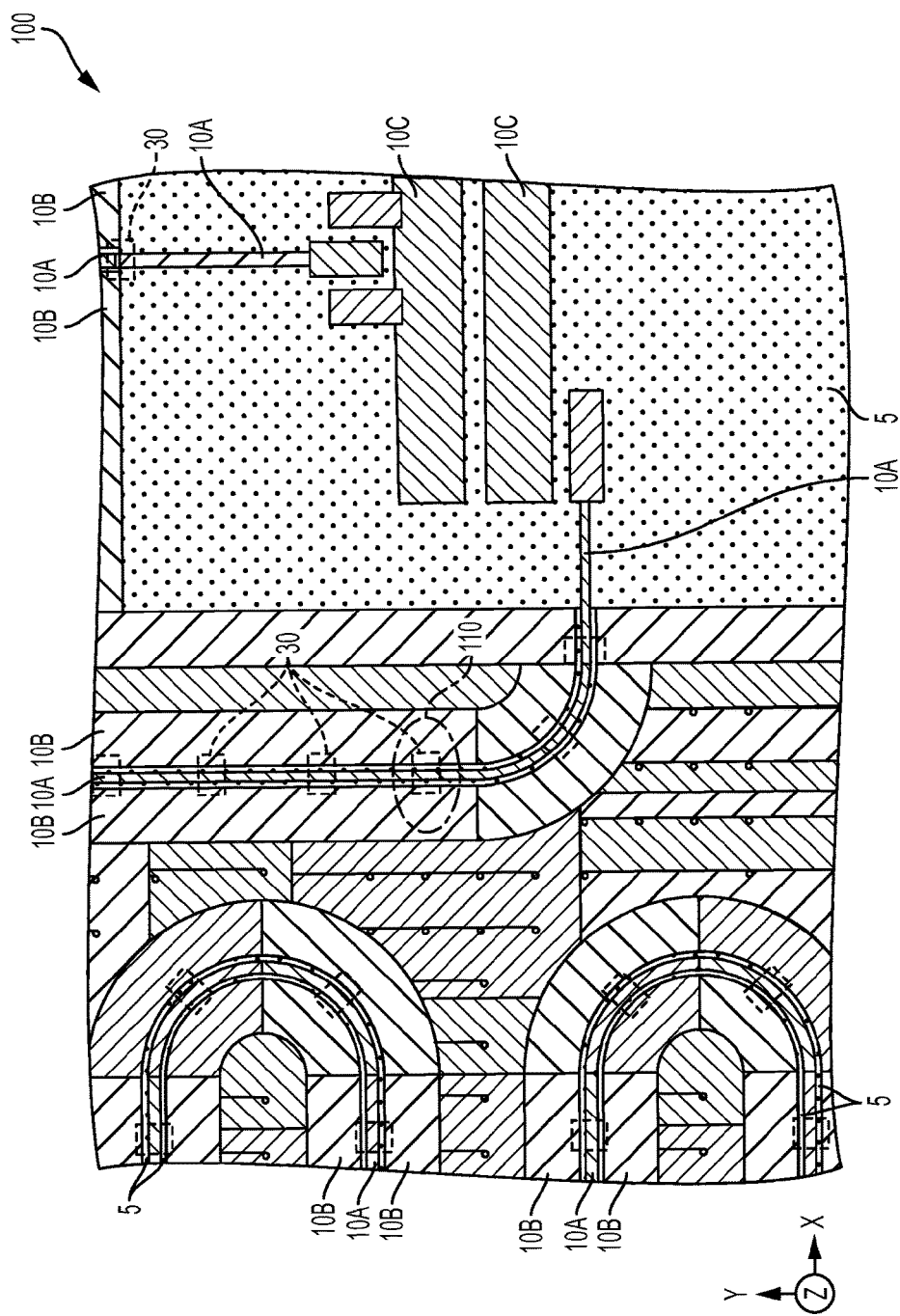
FIG. 1G is a top-down view of the superconducting microwave structure showing the sacrificial superconducting material.
Figure 1H:
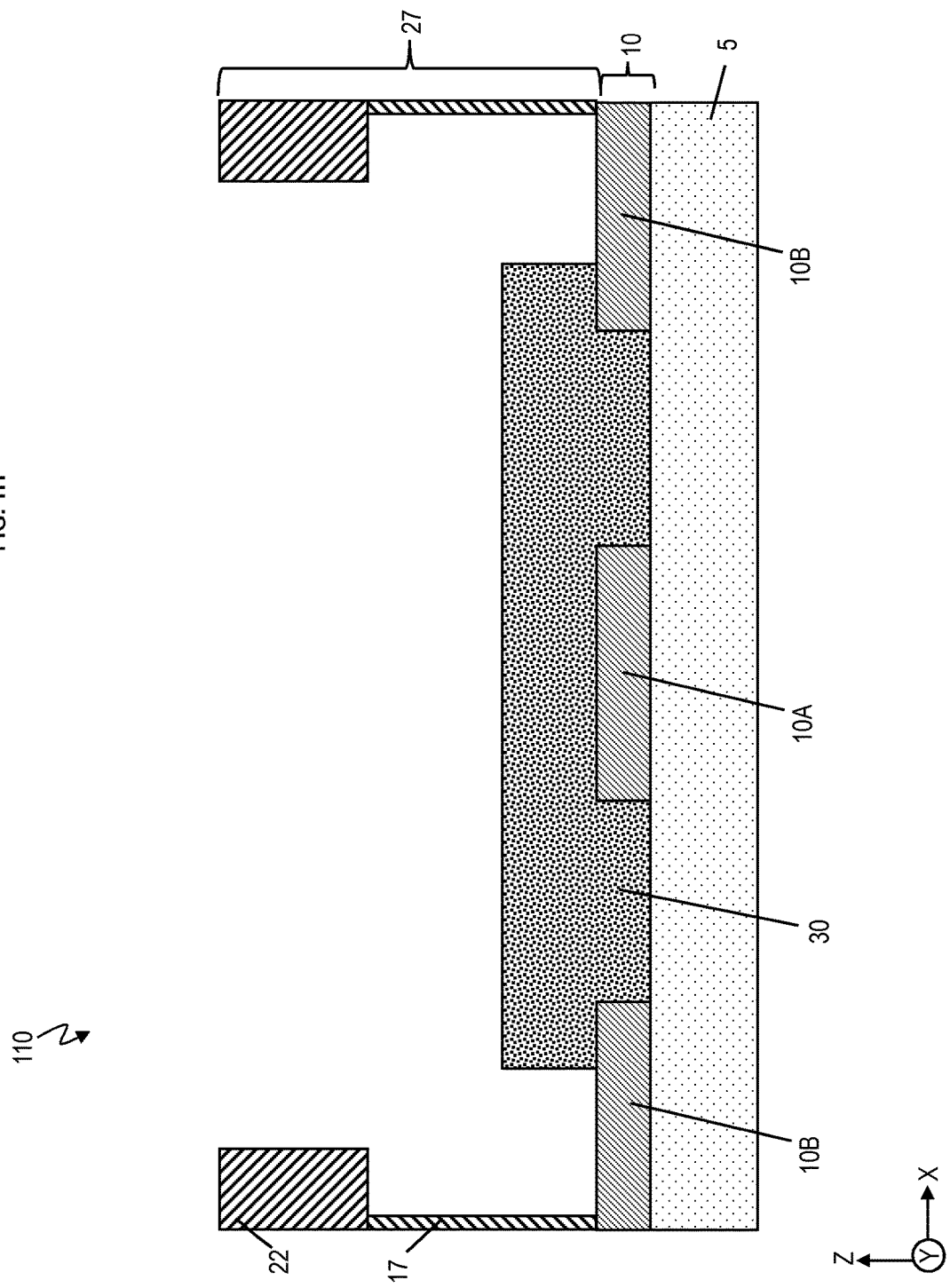
FIG. 1H is a cross-sectional view illustrating a second lift-off pattern of bilayers.
Figure 1I:
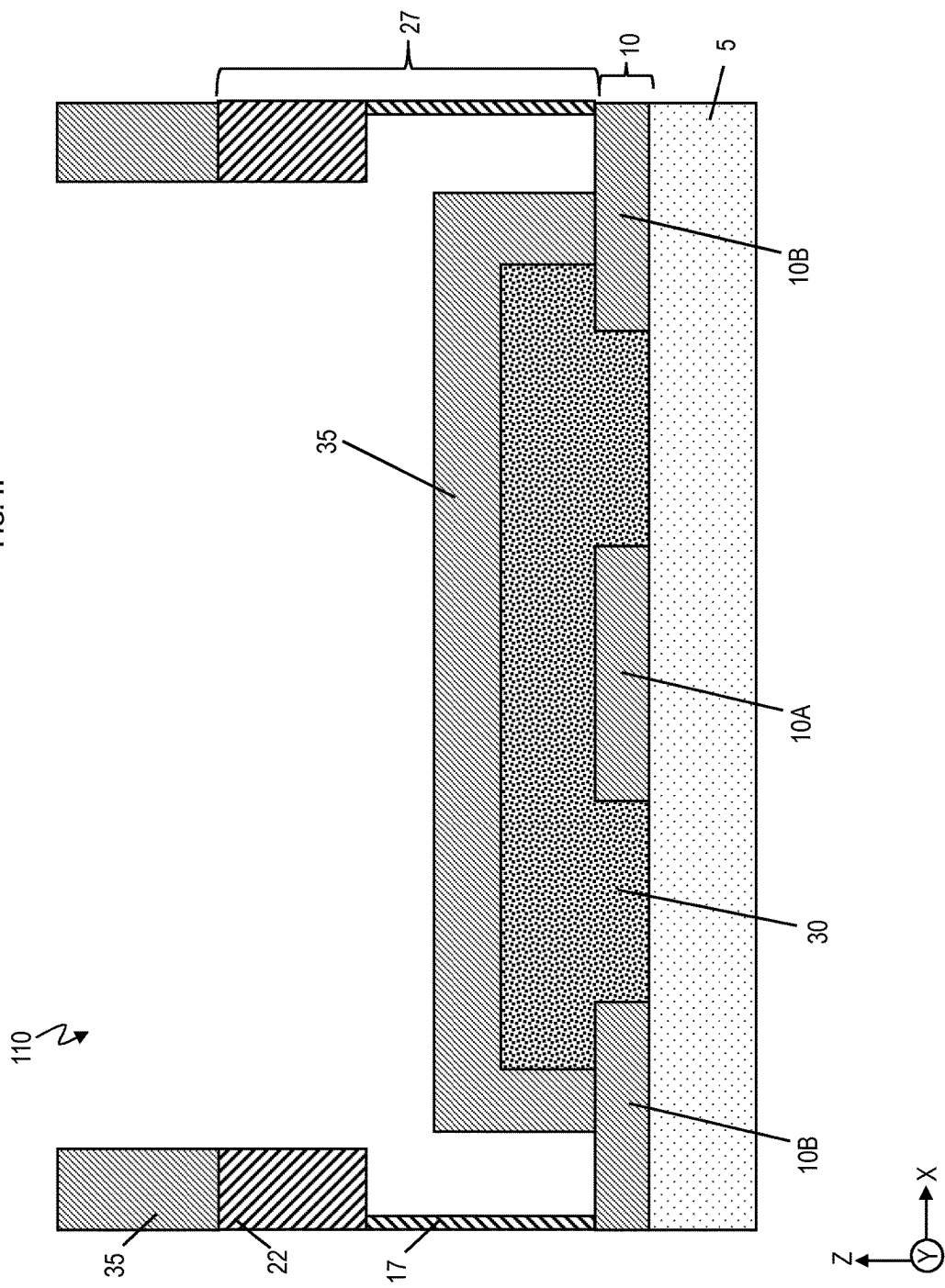
FIG. 1I is a cross-sectional view illustrating deposition of a cross-over superconducting material that is to form the superconducting airbridge.
Figure 1K:
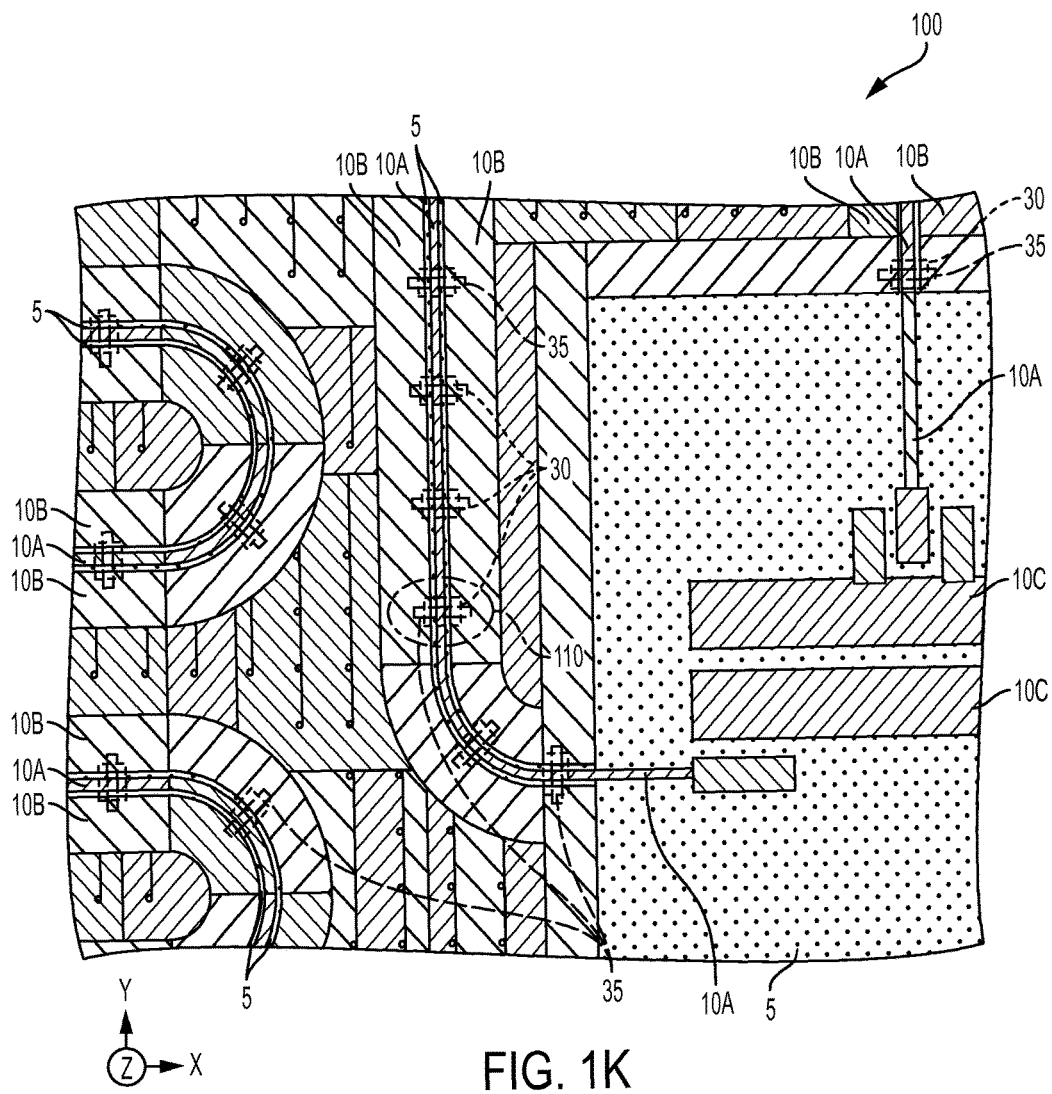
FIG. 1K is a top-down view of the superconducting microwave structure showing the superconducting material crossing over the sacrificial superconducting material.
Figure 1M:
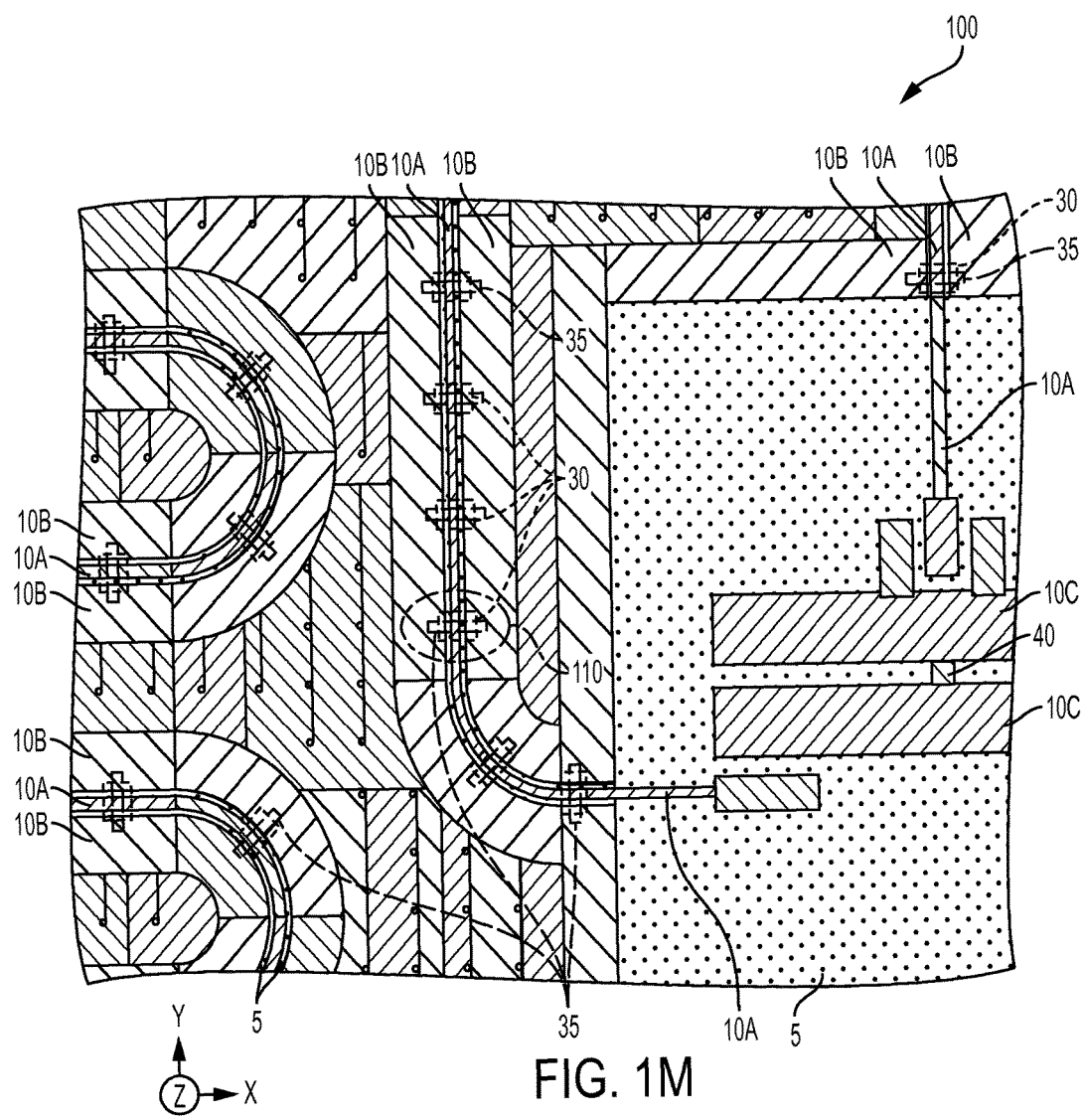
FIG. 1M is a top-down view of the superconducting microwave structure showing junction fabrication of a superconducting tunnel junction.
Figure 1N:
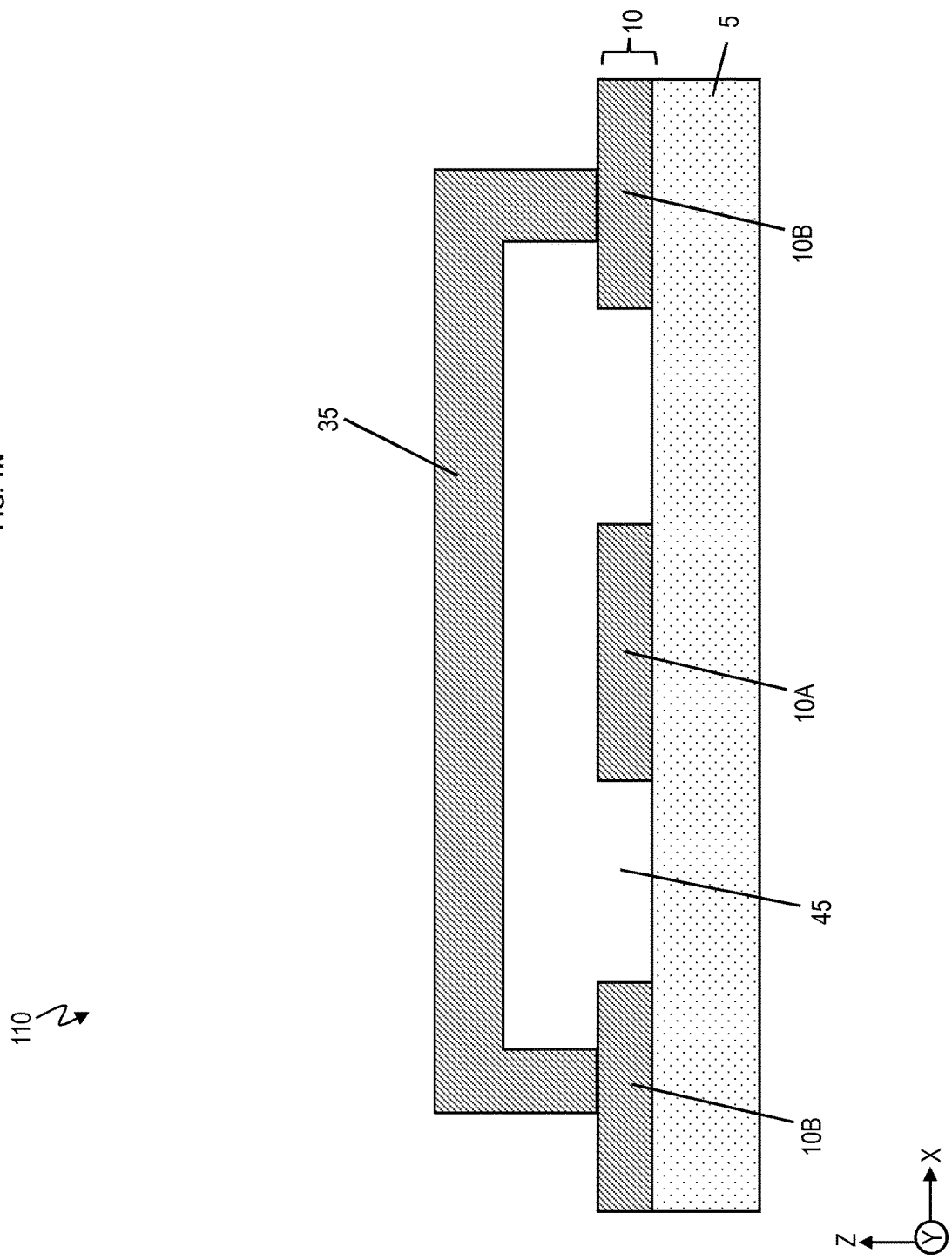

Now turning to the figures, FIGS. 1A through 1N illustrate a process of fabricating a superconducting airbridge using a superconducting sacrificial material according to an embodiment.

FIG. 1A begins with a starting schematic of a superconducting microwave structure 100 for building the superconducting airbridge. FIG. 1A is a top-down view of the superconducting microwave structure 100.

FIG. 1A shows a linear part 105 and a non-linear part 107. Superconducting material 10 is deposited on a substrate 5. The superconducting material 10 is patterned into various features including resonator layer 10A, ground plane layers 10B, and pad layers (paddles) 10C. The substrate 5 may be a material intended not to conduct electricity (e.g., intentionally without doping so as not to be conductive) in one case. In one implementation, the substrate 5 may be sapphire. In another implementation, the substrate may be high purity silicon. The superconducting material 10 forming the resonator layer 10A, ground plane layers 10B, and paddles 10C may be aluminum, titanium nitride, or any other superconducting material which is robust to endure the etch used to remove the sacrificial material. The superconducting material 10 is intended not to be etched away during the etching of the superconducting sacrificial layer discussed further below.

Superconducting material may be defined as a material that can conduct electricity or transport electrons from one atom to another with no resistance when the superconducting material has reached "critical temperature" (Tc), or the temperature at which the material becomes superconductive. Conducting electricity or transporting electrons from one atom to another with no resistance means that no heat, sound, or any other form of energy would be released from the material as understood by one skilled in the art.

Also, a circle is designated in FIG. 1A to illustrate an enlarged view 110 that is discussed below. FIG. 1B is a top-down view illustrating a breakout of the enlarged view 110 of the superconducting microwave structure 100. FIG. 1B shows the resonator 10A separated from the ground planes 10B by the substrate 5. The width of the resonator 10A in the x-axis may range from about 10 nanometers (nm) to 100 micrometers (um). The width of the ground planes in the x-axis may range from about three times the resonator width to an "infinite" ground plane which extends across the entire substrate surface. It is understood that the resonator 10A and ground planes 10B meander along the superconducting microwave structure 100 and their widths may not always be along the x-axis.

FIG. 1C is a cross-sectional view of the enlarged view 110 of the superconducting microwave structure 100 with the resonator 10A and ground planes 10B. The cross-sectional view is taken along line A-A of the enlarged view 110 in FIG. 1B. The thickness of the superconducting material 10 may range from 1 nm to 1 um, typically between 40 nm and 300 nm.

FIG. 1D is a cross-sectional view illustrating a first lift-off pattern 25 of bilayers in preparation for sacrificial material lithography. The bilayers of the lift-off pattern 25 include a lift-off resist layer 15 patterned on top of the ground planes 10B and a photoresist layer 20 patterned on top of the lift-off resist 15. The height of the lift-off resist 15 may range from about 300 nm to 1 um. The height of the photoresist 20 may range from about 50 to 300 nm. In one implementation the height in the z-axis of the lift-off resist 15 may be 800 nanometers (nm). In a lift-off process, the photoresist forms a mold, into which the desired material is deposited. The desired features are completed when photoresist under unwanted areas is dissolved and when the unwanted material is "lifted off". The reentrant profile 25 can be obtained by using an underlayer 15 which develops away faster than the optically patterned layer 20. Alternately, layer 20 may be a deposited hard mask such as germanium (Ge), which is patterned using lithography and etching.

FIG. 1E is a cross-sectional view illustrating deposition of the sacrificial superconducting material 30. The sacrificial superconducting material 30 is deposited on top of the resonator 10A, substrate 5, and ground planes 10B within the mold of the pattern 25. Additionally, sacrificial superconducting material 30 is deposited on top of the photoresist layer 20. The sacrificial superconducting material 30 may be, e.g., niobium and/or tantalum. The thickness in the z-axis of the sacrificial superconducting material 30 may range from 40 to 300 nm. The sacrificial superconducting material 30 may be deposited by, e.g., e-beam evaporation or any other directional deposition method. The deposition of the sacrificial superconducting material 30 forms in the center of the opening in the lift-off pattern 25 without completely filling the mold due to the directionality of the deposition.

FIG. 1F is a cross-sectional view illustrating that the lift-off process removes the first lift-off pattern 25. The lift-off process etches off the lift-off resist layer 15, along with any layers on top such as the photoresist layer 20 and sacrificial superconducting material 30. However, the sacrificial superconducting material 30 deposited directly on top of the resonator 10A, substrate 5, and ground planes 10B remains, and is not lifted off. The etchant (wet and/or dry) used during the lift-off process is designed to selectively attack the lift-off resist layer 15 (same analogy for lift-off resist layer 17 discussed below) such that the lift-off resist layer 15 is selectively dissolved. Consequently, dissolving the lift-off resist layer 15 causes any layers on top to be lifted off along with the lift-off resist layer 15. Alternately, feature 30 could be obtained using subtractive patterning, where a blanket layer of material is deposited and then unwanted portions are etched away using lithography and wet or dry etching.

FIG. 1G is a top-down view of the superconducting microwave structure 100 showing the sacrificial superconducting material 30 deposited directly deposited on top of the resonator 10A, substrate 5, and ground planes 10B. In FIG. 1G, the sacrificial superconducting material 30 is outlined as a rectangular shape so as not to obscure the figure.

FIG. 1H is a cross-sectional view illustrating a second lift-off pattern 27 (i.e., cross-over lift-off pattern) of bilayers in preparation for cross-over lithography. The bilayers of the second lift-off pattern 27 include a lift-off resist layer 17 patterned on top of the ground planes 10B and a photoresist layer 22 patterned on top of the lift-off resist 17. The photoresist layers 20 and 22 may be of the same materials, such as for example, positive resist or negative resist layers. The photoresist layers 20 and 22 are light sensitive such that they can be imaged with light and etched as desired without affecting other layers. The lift-off resist layer 15 and 17 may be of the same materials, such that the materials are dissolvable by the etchant during the lift-off process.

FIG. 1I is a cross-sectional view illustrating deposition of cross-over superconducting material 35 that is to form the superconducting airbridge. The cross-over superconducting material 35 is deposited on top of the sacrificial superconducting material 30 and ground planes 10B within the mold of the cross-over lift-off pattern 27. Additionally, cross-over superconducting material 35 is deposited on top of the photoresist layer 22. The thickness in the z-axis of the cross-over superconducting material 35 (to form the superconducting airbridge) may range from 40 to 300 nm. In one implementation, the cross-over superconducting material 35 may be aluminum. In another implementation, the cross-over superconducting material 35 may be titanium nitride. Alternately, feature 35 could be obtained using subtractive patterning, where a blanket layer of material is deposited and then unwanted portions are etched away using lithography and wet or dry etch.

FIG. 1J is a cross-sectional view illustrating that the lift-off process removes the second lift-off pattern 27. The lift-off process etches off the lift-off resist layer 17, along with any layers on top such as the photoresist layer 20 and superconducting material 35. However, after lift-off, the cross-over superconducting material 35 deposited directly on top of the sacrificial superconducting material 30 and on top of the ground planes 10B remains.

FIG. 1K is a top-down view of the superconducting microwave structure 100 showing the superconducting material 35 crossing over the sacrificial superconducting material 30 while contacting the ground planes 10B on both sides of the resonator 10A. FIG. 1K also shows the sacrificial superconducting material 30 deposited directly on top of the resonator 10A, the substrate 5, and the ground planes 10B. In FIG. 1K, both the superconducting material 35 (future airbridge) and the sacrificial superconducting material 30 are outlined as rectangular shapes so as not to obscure the figure.

FIG. 1L is a top-down view illustrating the enlarged view 110 of the superconducting microwave structure 100. Illustrated as a dashed line rectangular shape so as not to obscure the underlying layers, FIG. 1L shows the superconducting material 35 crossing over the sacrificial superconducting material 30 while contacting the grounds planes 10B on both sides of the resonator 10A. Also, illustrated as a dashed line rectangular shape so as not to obscure underlying layer, FIG. 1L shows the sacrificial superconducting material 30 directly on top of the resonator 10A, the substrate 5, and the ground planes 10B.

FIG. 1M is a top-down view of the superconducting microwave structure 100 showing junction fabrication of a superconducting tunnel junction 40 in contact with paddles 10C. The process of fabricating the superconducting tunnel junction 40 is understood by one skilled in the art. The superconducting tunnel junction (STJ), also known as a superconductor-insulator-superconductor tunnel junction (SIS), is an electronic device consisting of two superconductors separated by a very thin layer of insulating material. Current passes through the junction via the process of quantum tunneling. The STJ is a type of Josephson junction and is an important part of the qubit.

FIG. 1N is a cross-sectional view of the enlarged view 110 of the superconducting microwave structure 100 illustrating removal of the sacrificial superconducting material 30. In FIG. 1N, the superconducting material 35 is an airbridge from one ground plane 10B to the other ground plane 10B, all while crossing over the resonator 10A. The airbridge of superconducting material 35 is suspended over the airgap 45.

To form the airbridge of superconducting material 35, the sacrificial superconducting material 30 may be etched using a dry etch such as vapor etching or a wet etch. In one implementation, the vapor etchant may be $XeF_2$ and the sacrificial superconducting material 30 may be niobium. In another implementation, the sacrificial superconducting material 30 may be tantalum. The vapor etchant dissolves the sacrificial superconducting material 30 while leaving the substrate 5, the airbridge of superconducting material 35, the tunnel junction 40 (e.g., qubit), and the superconducting material 10 (e.g., resonator 10A, ground planes 10B, paddles 10C) all undamaged.

Etching the sacrificial superconducting material 30 does not negatively impact the previously formed tunnel junction 40. The superconducting materials of the airbridge of superconducting material 35, tunnel junction 40, and superconducting material layer 10 are different from the sacrificial superconducting material 30. For example, when the sacrificial superconducting material 30 is niobium, the superconducting materials of the airbridge of superconducting material 35, tunnel junction 40, and superconducting material layer 10 may be aluminum that is not etched away by the vapor etchant.

Figure 5:
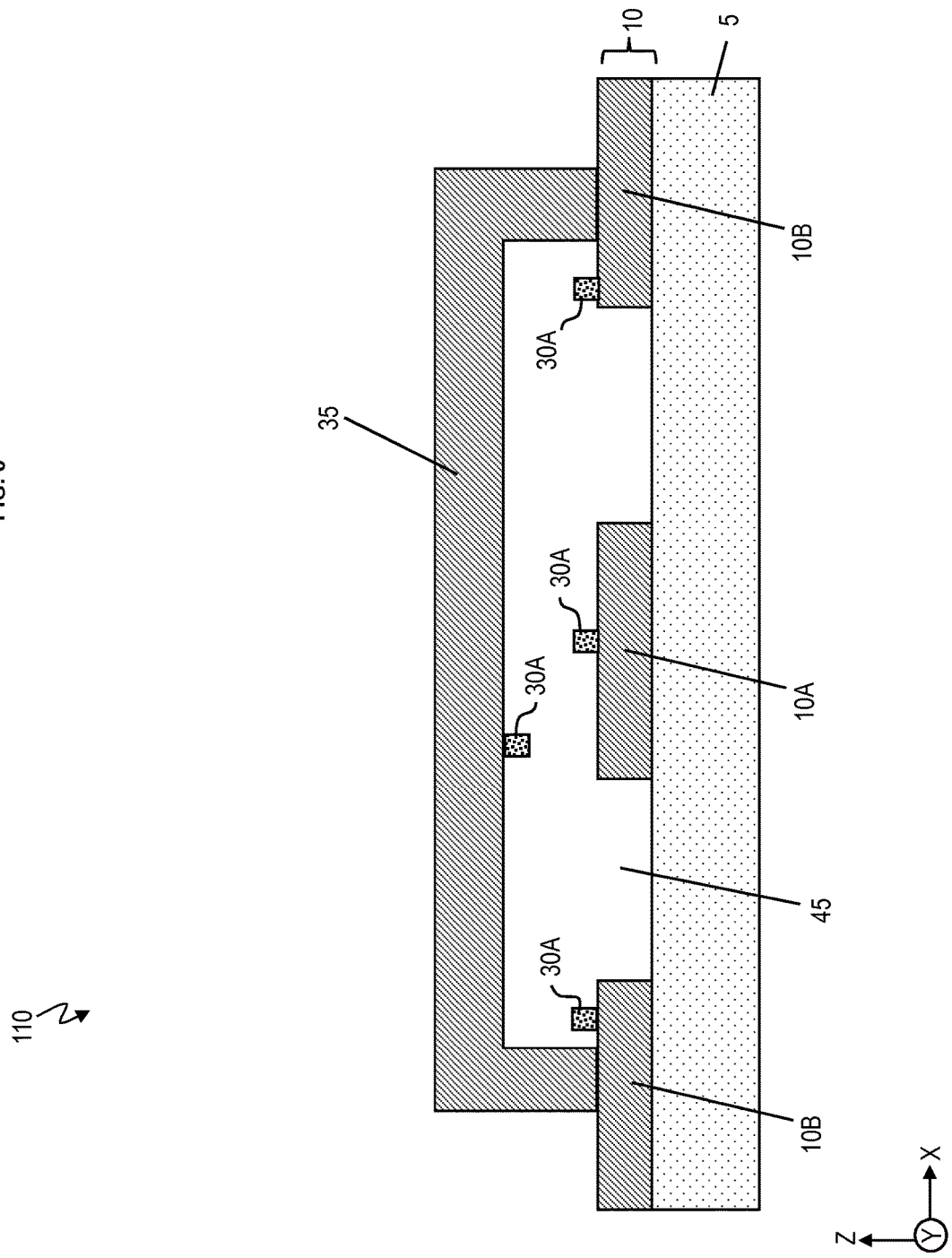
FIG. 5 illustrates an example showing one or more residual portions that may remain after etching the residual sacrificial superconducting material according to an embodiment.

In one case, if there happens to be a little residual sacrificial superconducting material 30 remaining on, e.g., the resonator 10A, ground planes 10B, paddles 10C, and/or the airbridge of superconducting material 35, the residual sacrificial superconducting material 30 (if any) does not include any lossy resist residue (after the removal process for the sacrificial resist material in the state-of-the-art) because no sacrificial resist material is utilized to form the airbridge of superconducting material 35. Additionally, the residual sacrificial superconducting material 30 does not degrade the performance of the superconducting microwave structure 100. According to an embodiment, FIG. 5 illustrates an example showing one or more residual portions 30A that may remain after etching the residual sacrificial superconducting material 30. However, these example residual portions 30A of sacrificial superconducting material 30 do not cause losses to the energy in tunnel junction 40 (qubit energy) because the residual sacrificial superconducting material 30 (i.e., residual portions 30A) is superconducting material.

In contrast, the state-the-art may have residual sacrificial resist material, and the leftover resist can drain the excitation energy from the qubit thus degrading the performance of the superconducting microwave structure.

The removal of the sacrificial superconducting material 30 using a vapor etch such as $XeF_2$ is compatible with highly delicate tunnel junctions 40, and thus suspension (i.e., creation of the airbridge of superconducting material 35) can be performed as the last step of device fabrication (e.g., after formation of the tunnel junction 40). $XeF_2$ is a room temperature, non-energetic etchant which has been shown not to affect Al—$Al_xO_y$—Al tunnel junctions. Although not shown for the sake of conciseness, all mechanically stressful steps such as dicing, lift-off with sonication, or wirebonding are performed before removal of the sacrificial superconducting material 30. Therefore, none of the mechanical stress associated with dicing, lift-off with sonication, or wirebonding is passed on to the superconducting airbridge 35 because the superconducting airbridge 35 has not been formed yet.

FIG. 2 illustrates a cross-sectional view of the enlarged view 110 according to another embodiment. FIG. 2 may include the fabrication process discussed in FIG. 1 along with additional operations discussed below. In this case, the superconducting material 10 may be titanium nitride, and the substrate 5 may be silicon. Unlike the description in FIG. 1, the substrate 5 (e.g., wafer) is annealed in $N_2$ or $O_2$ gas after patterning the superconducting material 10 (e.g., titanium nitride) into the resonator 10A, ground planes 10B, and paddles 10C. Also, the substrate 5 may be recessed between the resonator 10A and ground planes 10B. The $N_2$ or $O_2$ gas forms a protective layer 210 in recesses 205. The protective layer 210 extends upward to be formed partially along the sides of the resonator 10A and the ground planes 10B. The protective layer 210 may be silicon nitride or silicon dioxide depending on the gas utilized during annealing, and may be patterned as needed. These additional fabrication processes occur before proceeding with the cross-over fabrication. For example, these additional fabrication processes occur after FIG. 1C but before FIG. 1D. The protective layer is needed in the case of $XeF_2$ etch and silicon substrates, since $XeF_2$ attacks silicon; the protective layer 210 protects the silicon substrate during etching. However, in the case of sapphire substrates, the protective layer 210 is not needed since $XeF_2$ does not attack sapphire.

Figure 3A:
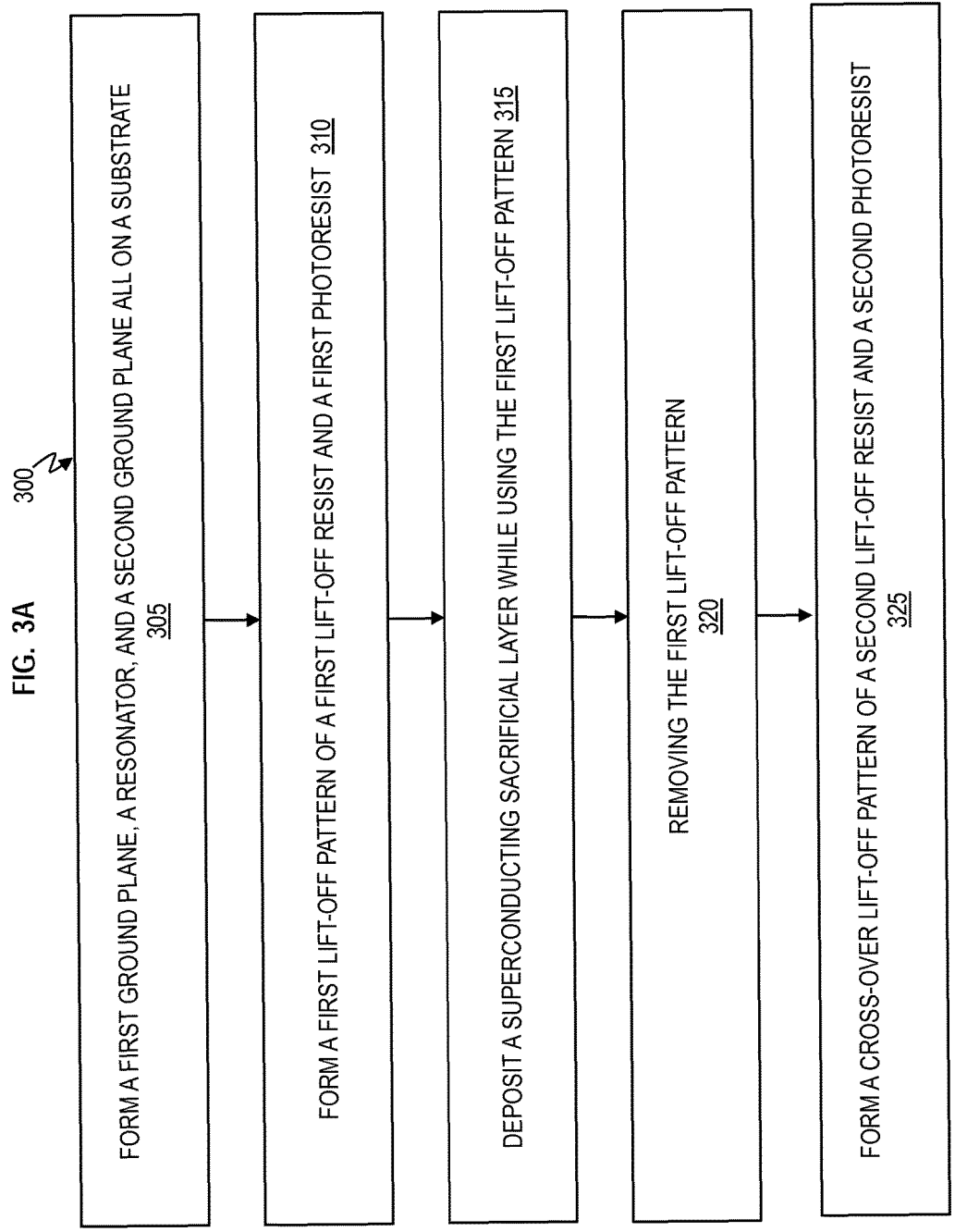

FIGS. 3A and 3B illustrate a method 300 of forming a superconducting airbridge on a structure 100 according to an embodiment.

At block 305, the first ground plane 10B, a resonator 10A, and a second ground plane 10B are all formed on the substrate 5. There are two ground planes 10B on both sides of the resonator 10A, as shown in FIGS. 1A, 1B, 1C.

At block 310, the first lift-off pattern 25 is formed of a first lift-off resist 15 and a first photoresist 20. An example is shown in FIG. 1D.

At block 315, the superconducting sacrificial layer 30 is deposited while using the first lift-off pattern 25 as a mold. An example is shown in FIG. 1E.

At block 320, the first lift-off pattern 25 is removed, such that the desired pattern of the superconducting sacrificial layer 30 remains, as shown in FIGS. 1F, 1G.

At block 325, a cross-over lift-off pattern 27 is formed of a second lift-off resist 17 and a second photoresist 22. An example is shown in FIG. 1H.

At block 330, the cross-over superconducting material 35 is deposited to be utilized as the superconducting airbridge 35 while using the cross-over lift-off pattern 27 as a mold. An example is shown in FIG. 1I.

At block 335, the cross-over lift-off pattern 27 is removed. The layers remaining after performing lift-off are illustrated in FIG. 1J, 1K, 1L.

At block 340, the superconducting airbridge 35 connecting the first ground plane 10B and the second ground plane 10B is formed by removing the superconducting sacrificial layer 30 underneath the cross-over superconducting material 35, where the superconducting airbridge 35 crosses over the resonator 10A. For example, FIG. 1N shows the superconducting airbridge 35 with the airgap 45 underneath.

The first lift-off resist 15 is formed on top of the first ground plane 10B (e.g., to the left of the resonator 10A) and the second ground plane 10B (e.g., to the right of the resonator 10A). The first photoresist 20 is formed on top of the first lift-off resist 15. Reference can be made to FIG. 1D.

The second lift-off resist 17 is formed on top of the first ground plane 10B (e.g., to the left of the resonator 10A) and the second ground plane 10B (e.g., to the right of the resonator 10A). The second photoresist 22 is formed on top of the second lift-off resist 17. Reference can be made to FIG. 1H.

Removing the superconducting sacrificial layer 30 underneath the cross-over superconducting material 35 to thereby form the superconducting airbridge 35 is performed by vapor etching utilizing a vapor etchant. The vapor etchant has a high selectivity for etching the superconducting sacrificial layer 30 (e.g., niobium), while not etching the first ground plane 10B, the resonator 10A, the second ground plane 10B, and the substrate 5 (along with the paddles 10C and tunnel junction 40). Since the vapor etchant has a high selectivity for etching the superconducting sacrificial layer 30, all other layers on the superconducting microwave structure 100 remain unaffected by the vapor etching.

In one implementation, the superconducting sacrificial layer 30 is niobium. In another implementation, the superconducting sacrificial layer 30 is tantalum. The substrate 5 includes sapphire. The first ground plane 10B, the resonator 10A, and the second ground plane 10B are a superconducting material not etched by the vapor etchant. In one case, the substrate 5 includes silicon.

The tunnel junction 40 is formed on the substrate 5 connecting first paddle 10C (e.g., in front of the tunnel junction 40) to the second paddle 10C (e.g., behind the tunnel junction 40), as illustrated in FIG. 1M. The tunnel junction 40 is a qubit. The resonator 10A is a readout resonator configured to read a state of the qubit.

Removing the superconducting sacrificial layer 30 underneath the cross-over superconducting material 35 to thereby form the superconducting airbridge 35 is performed by wet etching.

Figure 4A:
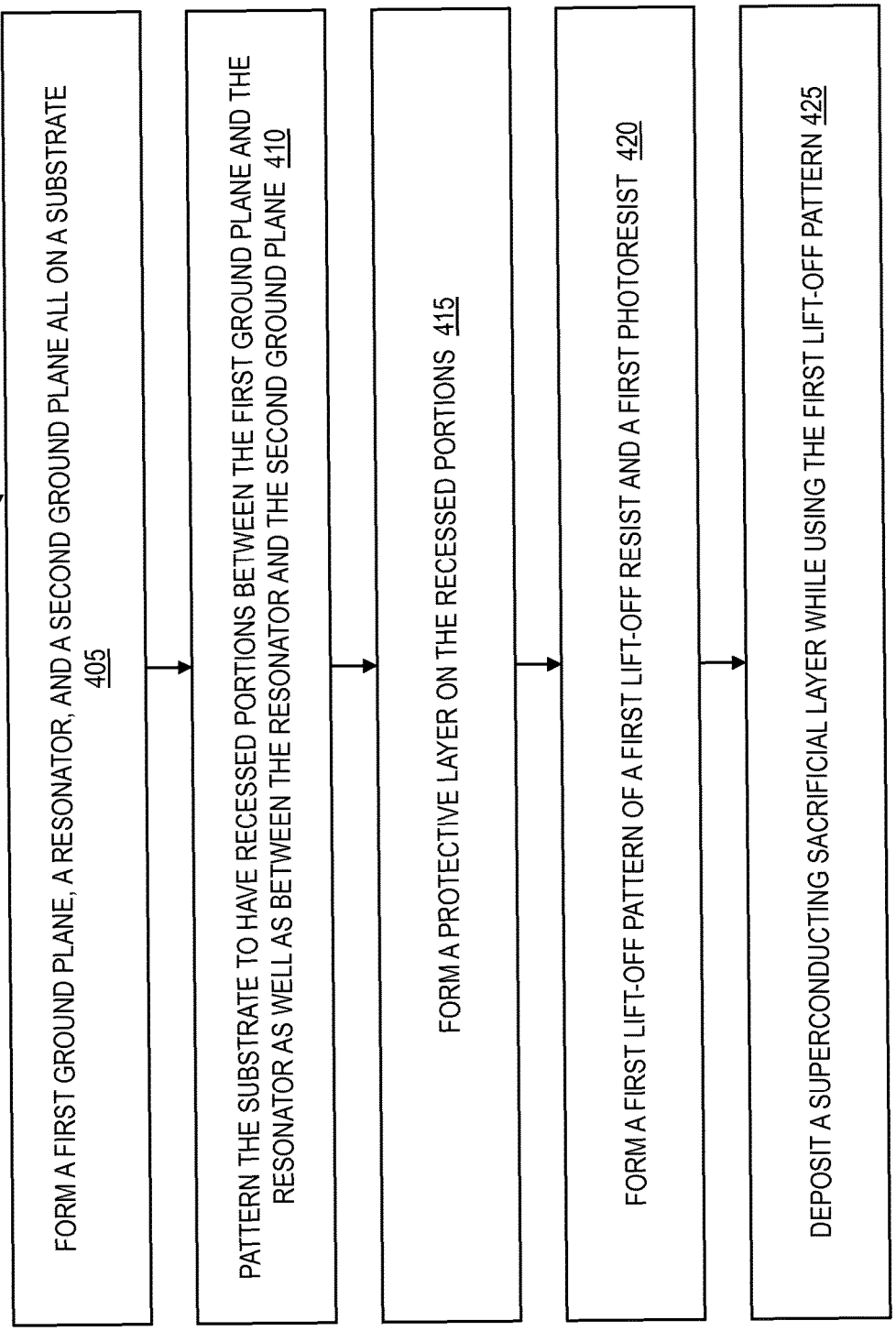

FIGS. 4A and 4B illustrate a method 400 of forming a superconducting airbridge on a structure 100.

At block 405, the first ground plane 10B, the resonator 10A, and the second ground plane 10B are all formed the substrate 5. Reference can be made to FIGS. 1A, 1B, 1C.

At block 410, the substrate 5 is patterned to have to have recessed portions 205 between the first ground plane 10B (e.g., to the left of the resonator 10A) and the resonator 10A as well as between the resonator 10A and the second ground plane 10B (e.g., to the right of the resonator 10A). Reference can be made to FIG. 2.

At block 415, the protective layer 210 is formed on the recessed portions 205. An example is illustrated in FIG. 2.

At block 420, the first lift-off pattern 25 is formed of a first lift-off resist 15 and a first photoresist 15. An example is shown in FIG. 1D with the modification of having the recessed portions 205 and protective layer 210 from FIG. 2.

At block 425, the superconducting sacrificial layer 30 is deposited while using the first lift-off pattern 25 as a mold. Reference can be made to FIG. 1E while taking into account changes made in FIG. 2.

At block 430, the first lift-off pattern 25 is removed, such that the desired pattern of the superconducting sacrificial layer 30 remains, as shown in FIGS. 1F, 1G in view of changes made in FIG. 2.

At block 435, a cross-over lift-off pattern 27 is formed of a second lift-off resist 17 and a second photoresist 22. Reference is made to FIG. 1H in view of changes made in FIG. 2.

At block 440, the cross-over superconducting material 35 is deposited to be utilized as the superconducting airbridge 35 while using the cross-over lift-off pattern 27 as a mold. An example is shown in FIG. 1I in view of the changes made in FIG. 2.

At block 445, the cross-over lift-off pattern 27 is removed. The layers remaining after performing lift-off are illustrated in FIG. 1J, 1K, 1L in view of the modifications made in FIG. 2

At block 450, the superconducting airbridge 35 connecting the first ground plane 10B and the second ground plane 10B is formed by removing the superconducting sacrificial layer 30 underneath the cross-over superconducting material 35, where the superconducting airbridge 35 crosses over the resonator 10A. As an example, FIG. 2 shows the superconducting airbridge 35 with the airgap 45 underneath, along with the protective layer 210 and recessed portions 205.

The protective layer 210 is at least one of a nitride layer and/or an oxide layer. The substrate 5 is silicon. The first ground plane 10B, the resonator 10A, and the second ground plane 10B are a superconducting material different from the superconducting sacrificial layer 30. The superconducting material of the first ground plane 10B, the resonator 10A, and the second ground plane 10B (along with the tunnel junction 40 and paddles 10C) includes titanium nitride.

It will be noted that various semiconductor device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A superconducting microwave structure comprising:
a first ground plane, a resonator, and a second ground plane formed on a substrate;
a superconducting airbridge connecting the first ground plane and the second ground plane, the superconducting airbridge having an airgap underneath from where a superconducting sacrificial layer has been removed; and
a residual portion of the superconducting sacrificial layer remaining on at least one of the first ground plane, the resonator, the second ground plane, and the superconducting airbridge;

wherein the first ground plane, the resonator, the second ground plane, and the superconducting airbridge are made of a superconducting material, the superconducting material is selected from the group consisting of aluminum and titanium nitride; and wherein the residual portion is selected from the group consisting of niobium and tantalum.

* * * * *